(12) United States Patent
Kim et al.

(10) Patent No.: US 10,747,110 B2
(45) Date of Patent: *Aug. 18, 2020

(54) COLORED PHOTOSENSITIVE RESIN COMPOSITION AND LIGHT SHIELDING SPACER PREPARED THEREFROM

(71) Applicant: Rohm and Haas Electronic Materials Korea Ltd., Cheonan (KR)

(72) Inventors: Ji Ung Kim, Hwaseong (KR); Hyung-Tak Jeon, Hwaseong (KR); Kyung-Jae Park, Hwaseong (KR); Jong-Ho Na, Hwaseong (KR); Hyung Gu Kim, Seo-gu (KR)

(73) Assignee: Rohm and Haas Electronic Materials Korea Ltd, Cheonan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/991,063

(22) Filed: May 29, 2018

(65) Prior Publication Data

US 2018/0356728 A1 Dec. 13, 2018

(30) Foreign Application Priority Data

Jun. 12, 2017 (KR) .................. 10-2017-0073434
May 10, 2018 (KR) .................. 10-2018-0053702

(51) Int. Cl.
| | | |
|---|---|---|
| G03F 7/038 | (2006.01) | |
| G03F 7/032 | (2006.01) | |
| G03F 7/031 | (2006.01) | |
| G03F 7/033 | (2006.01) | |
| G03F 7/40 | (2006.01) | |
| G03F 7/00 | (2006.01) | |

(Continued)

(52) U.S. Cl.
CPC .......... *G03F 7/032* (2013.01); *G02F 1/13394* (2013.01); *G03F 7/0007* (2013.01); *G03F 7/031* (2013.01); *G03F 7/033* (2013.01); *G03F 7/038* (2013.01); *G03F 7/105* (2013.01); *G03F 7/40* (2013.01); *G02F 2001/13398* (2013.01)

(58) Field of Classification Search
CPC ........ G03F 7/0007; G03F 7/105; G03F 7/031; G03F 7/032; G03F 7/0385; G03F 7/0388; G03F 7/038; G02F 1/133512; G02F 1/13394
USPC .... 430/7, 280.1, 281.1, 287.1; 349/110, 156
See application file for complete search history.

(56) References Cited

U.S. PATENT DOCUMENTS

2015/0060745 A1* 3/2015 Liao .................. G02B 1/04
                                                      252/586

FOREIGN PATENT DOCUMENTS

| JP | 2001-154206 | * | 6/2001 |
| KR | 10-0814660 B1 | | 3/2008 |
| KR | 2014-0147062 | * | 12/2014 |

* cited by examiner

*Primary Examiner* — John A McPherson
(74) *Attorney, Agent, or Firm* — S. Matthew Cairns (57) ABSTRACT

The present invention relates to a colored photosensitive resin composition that prevents the generation of uneven wrinkles when a cured film is formed, to thereby prevent spots that may be generated on the edges of a display upon the formation thereof, and has a short development time. Accordingly, the colored photosensitive resin composition can be advantageously used as a material for forming a protective film, an interlayer insulating film, a light shielding spacer such as a black column spacer, and the like to be (Continued)

employed in various electronic parts inclusive of a liquid crystal display (LCD) panel and an organic light emitting diode (OLED) display panel.

14 Claims, 3 Drawing Sheets

(51) Int. Cl.
*G03F 7/105* (2006.01)
*G02F 1/1339* (2006.01)

COLORED PHOTOSENSITIVE RESIN COMPOSITION AND LIGHT SHIELDING SPACER PREPARED THEREFROM

TECHNICAL FIELD

The present invention relates to a colored photosensitive resin composition suitable as a material for forming a protective film, an interlayer insulating film, a spacer, a light shielding member, and the like to be employed for a liquid crystal display (LCD) panel, an organic light emitting diode (OLED) display panel, and the like, and to a light shielding spacer produced from the composition.

BACKGROUND ART

Recently, a spacer prepared from a photosensitive resin composition is employed in order to maintain a constant distance between the upper and lower transparent substrates in liquid crystal cells of a liquid crystal display (LCD). In an LCD, which is an electro-optical device driven by a voltage applied to a liquid crystal material injected into a constant gap between two transparent substrates, it is very critical to maintain the gap between the two substrates to be constant. If there is an area in which the gap between the transparent substrates is not constant, the voltage applied thereto as well as the transmittance of light penetrating this area may vary, resulting in a defect of spatially non-uniform luminance. According to a recent demand for large LCD panels, it is even more critical to maintain a constant gap between two transparent substrates in an LCD. Such a spacer may be prepared by coating a photosensitive resin composition onto a substrate and exposing the coated substrate to ultraviolet rays and so on with a mask placed thereon, followed by development thereof. Recently, efforts of using a light shielding material for a spacer have been made; accordingly, various colored photosensitive resin compositions have been actively developed.

In recent years, a black column spacer (BCS) in which a column spacer and a black matrix are integrated into a single module using a colored photosensitive resin composition has been aimed to simplify the process steps. The colored photosensitive resin composition used in the production of such a black column spacer is required not only to easily form a step difference but also to meet an elastic recovery rate at the same time to have resistance to the pressure of the upper plate. Furthermore, if a cured film has uneven wrinkles on its surface when a bezel is formed from a colored photosensitive resin composition in a display panel, it may cause a serious disadvantage that the amount of injected liquid crystals may not be uniform due to a defect in the gap between the upper and lower plates during their assembly or that spots may be generated on the display screen due to a poor transmission of electric signals.

In the meantime, in order to impart a high light shielding property to a black column spacer (BCS), the content of a pigment added to the resin composition must be increased. In this regard, Korean Patent No. 0814660 discloses a black photosensitive resin composition comprising a black organic pigment, which has a good light shielding property and a low dielectric constant. However, if a large amount of a black organic pigment is employed, the pigment is eluted inside the spacer due to an increase in the amount of the organic pigment that has insufficient chemical resistance. In addition, as the amount of the pigment increases in the photosensitive resin composition for forming a spacer, the amounts of a binder, a photopolymerizable compound, and the like are relatively reduced, which causes a problem that the elastic recovery rate of the spacer is lowered.

DISCLOSURE OF INVENTION

Technical Problem

Accordingly, an object of the present invention is to provide a colored photosensitive resin composition capable of forming a cured film that minimizes the generation of uneven wrinkles on its surface and satisfies the step difference characteristics, the chemical resistance, the elastic recovery rate, and the light shielding property at the same time without significantly increasing the amount of a pigment in the photosensitive resin composition for forming a spacer, and a light shielding spacer produced therefrom.

Solution to Problem

In order to accomplish the above object, the present invention provides a colored photosensitive resin composition, which comprises:

(A) a copolymer comprising an epoxy group;
(B) a photopolymerizable compound comprising a double bond;
(C) a photopolymerization initiator; and
(D) a colorant comprising a black inorganic colorant, wherein the colorant comprises 50 to 100% by weight of the black inorganic colorant based on the total weight of the solid content of the colorant, and the molar ratio of the double bonds in the photopolymerizable compound (B) to the epoxy groups in the copolymer (A) satisfies the following relationship:

$$4 \leq \text{number of moles of double bonds/number of moles of epoxy groups} \leq 35.$$

Further, the present invention provides a light shielding spacer produced from the colored photosensitive resin composition.

Advantageous Effects of Invention

The colored photosensitive resin composition of the present invention prevents the generation of uneven wrinkles when a cured film is formed, to thereby prevent spots that may be generated on the edges of a display upon the formation thereof, and has a short development time. Accordingly, the colored photosensitive resin composition can be advantageously used as a material for forming a protective film, an interlayer insulating film, a light shielding spacer such as a black column spacer, and the like to be employed in various electronic parts inclusive of a liquid crystal display (LCD) panel and an organic light emitting diode (OLED) display panel.

In addition, the colored photosensitive resin composition of the present invention is capable of forming a cured film that satisfies the step difference property, the chemical resistance, the elastic recovery rate, and the light shielding property at the same time without significantly increasing the amount of a pigment.

DETAILED DISCLOSURE FOR CARRYING OUT THE INVENTION

The colored photosensitive resin composition of the present invention comprises (A) a copolymer comprising an epoxy group; (B) a photopolymerizable compound comprising a double bond; (C) a photopolymerization initiator; and (D) a colorant comprising a black inorganic colorant, wherein the colorant comprises 50 to 100% by weight of the black inorganic colorant based on the total weight of the solid content of the colorant, and the molar ratio of the double bonds in the photopolymerizable compound (B) to the epoxy groups in the copolymer (A) satisfies the following relationship:

$$4 \leq \text{number of moles of double bonds/number of moles of epoxy groups} \leq 35.$$

In the present disclosure, "(meth)acryl" means "acryl" and/or "methacryl," and "(meth)acrylate" means "acrylate" and/or "methacrylate."

Hereinafter, each component of the colored photosensitive resin composition will be explained in detail.

(A) Copolymer Comprising an Epoxy Group

The copolymer employed in the present invention comprises (a-1) a structural unit derived from an ethylenically unsaturated carboxylic acid, an ethylenically unsaturated carboxylic anhydride, or a combination thereof, (a-2) a structural unit derived from an ethylenically unsaturated compound containing an aromatic ring, and (a-3) a structural unit derived from an ethylenically unsaturated compound containing an epoxy group, and may further comprise (a-4) a structural unit derived from an ethylenically unsaturated compound different from the structural units (a-1), (a-2), and (a-3).

The copolymer is an alkali-soluble resin for materializing developability and also plays the role of a base for forming a film upon coating and a structure for forming a final pattern.

(a-1) Structural Unit Derived from an Ethylenically Unsaturated Carboxylic Acid, an Ethylenically Unsaturated Carboxylic Anhydride, or a Combination Thereof.

The structural unit (a-1) is derived from an ethylenically unsaturated carboxylic acid, an ethylenically unsaturated carboxylic anhydride, or a combination thereof. The ethylenically unsaturated carboxylic acid and the ethylenically unsaturated carboxylic anhydride is a polymerizable unsaturated monomer containing at least one carboxyl group in the molecule. Particular examples thereof may include an unsaturated monocarboxylic acid such as (meth)acrylic acid, crotonic acid, α-chloroacrylic acid, and cinnamic acid; an unsaturated dicarboxylic acid and an anhydride thereof such as maleic acid, maleic anhydride, fumaric acid, itaconic acid, itaconic anhydride, citraconic acid, citraconic anhydride, and mesaconic acid; an unsaturated polycarboxylic acid of trivalence or more and an anhydride thereof; and a mono[(meth)acryloyloxyalkyl] ester of a polycarboxylic acid of divalence or more such as mono[2-(meth)acryloyloxyethyl] succinate, mono[2-(meth)acryloyloxyethyl] phthalate, and the like. The structural unit derived from the above exemplified compounds may be comprised in the copolymer alone or in combination of two or more.

The amount of the structural unit (a-1) may be 5 to 65% by mole, or 10 to 50% by mole, based on the total moles of the structural units constituting the copolymer. Within the above amount range, the developability may be favorable.

(a-2) Structural Unit Derived from an Ethylenically Unsaturated Compound Containing an Aromatic Ring The structural unit (a-2) is derived from an ethylenically unsaturated compound containing an aromatic ring. Particular examples of the ethylenically unsaturated compound containing an aromatic ring may include phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tribromophenyl (meth)acrylate; styrene; styrene containing an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; styrene containing a halogen such as fluorostyrene, chlorostyrene, bromostyrene, and iodostyrene; styrene containing an alkoxy substituent such as methoxystyrene, ethoxystyrene, and propoxystyrene; 4-hydroxystyrene, p-hydroxy-α-methylstyrene, acetylstyrene; and vinyltoluene, divinylbenzene, vinylphenol, o-vinylbenzyl methyl ether, m-vinylbenzyl methyl ether, p-vinylbenzyl methyl ether, o-vinylbenzyl glycidyl ether, m-vinylbenzyl glycidyl ether, p-vinylbenzyl glycidyl ether, and the like. The structural unit derived from the above exemplified compounds may be comprised in the copolymer alone or in combination of two or more. A structural unit derived from the styrene-based compounds among the above compounds is preferable in consideration of polymerizability.

The amount of the structural unit (a-2) may be 2 to 70% by mole, or 3 to 60% by mole, based on the total moles of the structural units constituting the copolymer. Within the above amount range, the chemical resistance may be more favorable.

(a-3) Structural Unit Derived from an Ethylenically Unsaturated Compound Containing an Epoxy Group The structural unit (a-3) is derived from an ethylenically unsaturated compound containing an epoxy group. Particular examples of the ethylenically unsaturated compound containing an epoxy group may include glycidyl (meth)acrylate, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, 4-hydroxybutyl (meth)acrylate glycidyl ether, allyl glycidyl ether, 2-methylallyl glycidyl ether, and the like. The structural unit derived from the above exemplified compounds may be comprised in the copolymer alone or in combination of two or more. A structural unit derived from glycidyl (meth)acrylate and/or 4-hydroxybutyl (meth)acrylate glycidyl ether among the above is more preferable in view of copolymerizability and improvement in the strength of an insulating film.

The amount of the structural unit (a-3) may be 1 to 40% by mole, or 5 to 20% by mole, based on the total moles of the structural units constituting the copolymer. Within the above amount range, the residues during the process and the margins at the time of pre-bake may be more favorable.

(a-4) Structural Unit Derived from an Ethylenically Unsaturated Compound Different from the Structural Units (a-1), (a-2), and (a-3)

The copolymer employed in the present invention may further comprise a structural unit derived from an ethylenically unsaturated compound different from the structural units (a-1), (a-2), and (a-3) in addition to the structural units (a-1), (a-2), and (a-3).

Particular examples of the structural unit derived from an ethylenically unsaturated compound different from the structural units (a-1), (a-2), and (a-3) may include an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth) acrylate, cyclohexyl (meth)acrylate, ethylhexyl (meth)acrylate, tetrahydrofurfuryl (meth)acrylate, hydroxyethyl (meth) acrylate, 2-hydroxypropyl (meth)acrylate, 2-hydroxy-3-chloropropyl (meth)acrylate, 4-hydroxybutyl (meth) acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly(ethylene glycol) methyl ether (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine containing an N-vinyl group such as N-vinyl pyrrolidone, N-vinyl carbazole, and N-vinyl morpholine; an unsaturated ether such as vinyl methyl ether and vinyl ethyl ether; an unsaturated imide such as N-phenylmaleimide, N-(4-chlorophenyl)maleimide, N-(4-hydroxyphenyl)maleimide, N-cyclohexylmaleimide, and the like. The structural unit derived from the above exemplified compounds may be comprised in the copolymer alone or in combination of two or more. A structural unit derived from an unsaturated imide, specifically N-substituted maleimide, among the above is more preferable in view of copolymerizability and improvement in the strength of an insulating film.

The amount of the structural unit (a-4) may be 0 to 80% by mole, or 30 to 70% by mole, based on the total moles of the structural units constituting the copolymer. Within the above amount range, the storage stability of a colored photosensitive resin composition may be maintained, and the film retention rate may be more advantageously improved.

Examples of the copolymer having the structural units (a-1) to (a-4) may include a copolymer of (meth)acrylic acid/styrene/methyl (meth)acrylate/glycidyl (meth)acrylate, a copolymer of (meth)acrylic acid/styrene/methyl (meth) acrylate/glycidyl (meth)acrylate/N-phenylmaleimide, a copolymer of (meth)acrylic acid/styrene/methyl (meth)acrylate/glycidyl (meth)acrylate/N-cyclohexylmaleimide, a copolymer of (meth)acrylic acid/styrene/n-butyl (meth) acrylate/glycidyl (meth)acrylate/N-phenylmaleimide, a copolymer of (meth)acrylic acid/styrene/glycidyl (meth) acrylate/N-phenylmaleimide, a copolymer of (meth)acrylic acid/styrene/4-hydroxybutyl (meth)acrylate glycidyl ether/N-phenylmaleimide, and the like. One, two, or more of the copolymers may be comprised in the colored photosensitive resin composition.

The weight average molecular weight (Mw) of the copolymer may be in the range of 5,000 to 30,000 g/mol, or 10,000 to 20,000 g/mol, when determined by gel permeation chromatography (eluent: tetrahydrofuran) referenced to polystyrene. If the weight average molecular weight of the copolymer is within the above range, the step difference by a lower pattern may be advantageously improved, and a pattern profile upon development may be favorable.

The amount of the copolymer in the colored photosensitive resin composition may be 5 to 60% by weight, or 8 to 45% by weight, based on the total weight of the solid content (i.e., the weight excluding solvents) of the colored photosensitive resin composition. Within the above range, a pattern profile upon development may be favorable, and the development time, surface characteristics, and the like of a cured film formed from the resin composition may be improved.

The copolymer may be prepared by charging to a reactor a radical polymerization initiator, a solvent, and the structural units (a-1) to (a-4), followed by charging nitrogen thereto and slowly stirring the mixture for polymerization.

The radical polymerization initiator may be an azo compound such as 2,2'-azobisisobutyronitrile, 2,2'-azobis(2,4-dimethylvaleronitrile), and 2,2'-azobis(4-methoxy-2,4-dimethylvaleronitrile); or benzoyl peroxide, lauryl peroxide, t-butyl peroxypivalate, 1,1-bis(t-butylperoxy)cyclohexane, or the like, but is not limited thereto. The radical polymerization initiator may be used alone or in combination of two or more.

The solvent may be any conventional solvent commonly used in the preparation of a copolymer and may include, for example, propylene glycol monomethyl ether acetate (PGMEA).

(B) Photopolymerizable Compound Comprising a Double Bond

The photopolymerizable compound employed in the present invention is a compound that has a double bond and is polymerizable by the action of a polymerization initiator. Specifically, the photopolymerizable compound may comprise a monofunctional or polyfunctional ester compound having at least one ethylenically unsaturated double bond and may preferably comprise a polyfunctional compound having at least two functional groups from the view point of chemical resistance.

The photopolymerizable compound may be selected from the group consisting of ethylene glycol di(meth)acrylate, propylene glycol di(meth)acrylate, diethylene glycol di(meth)acrylate, triethylene glycol di(meth)acrylate, 1,6-hexanediol di(meth)acrylate, polyethylene glycol di(meth)acrylate, polypropylene glycol di(meth)acrylate, glycerin tri(meth) acrylate, trimethylolpropane tri(meth)acrylate, pentaerythritol tri(meth)acrylate, a monoester of pentaerythritol tri (meth)acrylate and succinic acid, pentaerythritol tetra(meth) acrylate, dipentaerythritol penta(meth)acrylate, dipentaerythritol hexa(meth)acrylate, a monoester of dipentaerythritol penta(meth)acrylate and succinic acid, pentaerythritol triacrylate-hexamethylene diisocyanate (a reaction product of pentaerythritol triacrylate and hexamethylene diisocyanate), tripentaerythritol hepta(meth) acrylate, tripentaerythritol octa(meth)acrylate, bisphenol A epoxyacrylate, and ethylene glycol monomethyl ether acrylate, and a mixture thereof, but is not limited thereto.

Examples of the photopolymerizable compound commercially available may include (i) monofunctional (meth) acrylate such as Aronix M-101, M-111, and M-114 manufactured by Toagosei Co., Ltd., KAYARAD T4-110S and T4-120S manufactured by Nippon Kayaku Co., Ltd., and V-158 and V-2311 manufactured by Osaka Yuki Kayaku Kogyo Co., Ltd.; (ii) bifunctional (meth)acrylate such as Aronix M-210, M-240, and M-6200 manufactured by Toagosei Co., Ltd., KAYARAD HDDA, HX-220, and R-604 manufactured by Nippon Kayaku Co., Ltd., and V-260, V-312, and V-335 HP manufactured by Osaka Yuki Kayaku Kogyo Co., Ltd.; and (iii) tri- and higher functional (meth) acrylate such as Aronix M-309, M-400, M-403, M-405, M-450, M-7100, M-8030, M-8060, and TO-1382 manufactured by Toagosei Co., Ltd., KAYARAD TMPTA, DPHA, and DPHA-40H manufactured by Nippon Kayaku Co., Ltd., and V-295, V-300, V-360, V-GPT, V-3PA, V-400, and V-802 manufactured by Osaka Yuki Kayaku Kogyo Co., Ltd.

The amount of the photopolymerizable compound may be 5 to 50% by weight, or 10 to 40% by weight, based on the total weight of the solid content (i.e., the weight excluding solvents) of the colored photosensitive resin composition. If the amount of the photopolymerizable compound is within the above range, a pattern may be readily developed since it is possible to prevent the problems that the development time is prolonged and the process and residues are affected thereby, and it is possible to prevent the problems that the pattern resolution becomes poor and that wrinkles are generated on the surface.

The molar ratio of the double bonds in the photopolymerizable compound (B) to the epoxy groups in the copolymer (A) may satisfy the following relationship:

$$4 \leq \text{number of moles of double bonds/number of moles of epoxy groups} \leq 35.$$

If a cured film for a display bezel has uneven wrinkles on its surface, it may cause a disadvantage that the amount of injected liquid crystals may not be uniform due to a defect in the gap between the upper and lower plates during their assembly or that spots may be generated on the display screen due to a poor transmission of electric signals. However, if the colored photosensitive resin composition of the present invention satisfies the molar ratio defined by the above relationship, the generation of uneven wrinkles on the surface of a cured film is minimized, and it is possible to form a step difference and a pattern in a high resolution.

If the molar ratio exceeds 35 as the number of moles of double bonds is increased, the curing of the surface of a coated film during the exposure to light is strongly taken place, while materials having unreacted double bonds remain in its interior, which raises the flowability (i.e., mobility) of such unreacted materials in the subsequent thermal curing process. As a result, the polymer near the surface and the polymer deep inside the pattern would have different mobilities during the thermal curing, resulting in uneven wrinkles on the surface of the cured film. In addition, if the molar ratio is less than 4, it is difficult to control the degree of crosslinking in accordance with changes in the temperature since the number of moles of epoxy groups is relatively larger than the number of moles of double bonds, which makes poor the development margins in accordance with temperature changes during the process and, thus, lowers the resolution.

Particularly, the molar ratio of the double bonds in the photopolymerizable compound (B) to the epoxy groups in the copolymer (A) may satisfy the following relationship:

$$11 \leq \text{number of moles of double bonds/number of moles of epoxy groups} \leq 35.$$

(C) Photopolymerization Initiator

The photopolymerization initiator employed in the present invention may be any known polymerization initiator.

The photopolymerization initiator may be selected from the group consisting of an acetophenone-based compound, a non-imidazole-based compound, a triazine-based compound, an onium salt-based compound, a benzoin-based compound, a benzophenone-based compound, a polynuclear quinone-based compound, a thioxanthone-based compound, a diazo-based compound, an imidesulfonate-based compound, an oxime-based compound, a carbazole-based compound, a sulfonium borate-based compound, a ketone-based compound, and a mixture thereof. Specifically, the photopolymerization initiator may be at least one selected from the group consisting of an oxime-based compound, a triazine-based compound, and a ketone-based compound. More specifically, a combination of an oxime-based compound, a triazine-based compound, and a ketone-based compound may be used.

Particular examples of the photopolymerization initiator may include 2,2'-azobis(2,4-dimethylvaleronitrile), 2,2'-azobis(4-methoxy-2,4-dimethylvaleronitrile), benzoyl peroxide, lauryl peroxide, t-butyl peroxy pivalate, 1,1-bis(t-butylperoxy)cyclohexane, p-dimethylaminoacetophenone, 2-benzyl-2-(dimethylamino)-1-[4-(4-morpholinyl)phenyl]-1-butanone, 2-hydroxy-2-methyl-1-phenyl-propan-1-one, benzyl dimethyl ketal, benzophenone, benzoin propyl ether, diethyl thioxanthone, 2,4-bis (trichloromethyl)-6-p-methoxyphenyl-s-triazine, 2-trichloromethyl-5-styryl-1,3,4-oxodiazole, 9-phenylacridine, 3-methyl-5-amino-((s-triazin-2-yl)amino)-3-phenylcoumarin, 2-(o-chlorophenyl)-4,5-diphenylimidazolyl dimer, 1-phenyl-1,2-propanedione-2-(o-ethoxycarbonyl)oxime, 1-[4-(phenylthio)phenyl]-octane-1,2-dione-2-(o-benzoyloxime), o-enoyl-4'-(benzmercapto) benzoyl-hexyl-ketoxime, 2,4,6-trimethylphenylcarbonyl-diphenylphosphonyloxide, a hexafluorophosphoro-trialkylphenylsulfonium salt, 2-mercaptobenzimidazole, 2,2'-benzothiazolyl disulfide, (E)-2-(4-styrylphenyl)-4,6-bis (trichloromethyl)-1,3,5-triazine, 2-dimethylamino-2-(4-methylbenzyl)-1-(4-morpholin-4-ylphenyl)-butane-1-one, and a mixture thereof, but is not limited thereto.

For information, examples of the oxime-based photopolymerization initiators commercially available include OXE-01 (BASF), OXE-02 (BASF), OXE-03 (BASF), N-1919 (ADEKA), NCI-930 (ADEKA), and NCI-831 (ADEKA).

The photopolymerization initiator may be employed in an amount of 0.1 to 15% by weight, or 0.1 to 10% by weight, based on the total weight of the solid content (i.e., the weight excluding solvents) of the colored photosensitive resin composition. Specifically, 0.1 to 2% by weight of an oxime-based compound, 0.1 to 2% by weight of a triazine-based compound, and 0.1 to 2% by weight of a ketone-based compound, based on the total weight of the solid content (i.e., the weight excluding solvents) of the colored photosensitive resin composition, may be used as the photopolymerization initiator. More specifically, 0.5 to 1.5% by weight of an oxime-based compound, 0.5 to 1.5% by weight of a triazine-based compound, and 0.5 to 1.5% by weight of a ketone-based compound, based on the total weight of the solid content (i.e., the weight excluding solvents) of the colored photosensitive resin composition, may be used as the photopolymerization initiator. If an oxime-based compound is used within the above amount range, the development and coating characteristics may be improved with high sensitivity. In addition, if an triazine-based compound is used within the above amount range, a coated film with excellent chemical resistance and taper angles upon formation of a pattern may be obtained. Furthermore, if a ketone-based compound is used within the above amount range, a colored photosensitive resin composition thus prepared can form a coated film with excellent chemical resistance through the curing of the deep inside of the coated film.

(D) Colorant

The colored photosensitive resin composition of the present invention comprises a colorant to impart the light shielding property thereto. The colorant may be a mixture of two or more inorganic or organic colorants. It preferably has high chromogenicity and high heat resistance.

The colorant comprises a black inorganic colorant. In addition, the colorant may include a black organic colorant. Further, the colorant may comprise a chromatic coloring agent such as blue, violet, and the like other than black.

Any black inorganic colorant and any black organic colorant known in the art may be used. For example, any compounds classified as a pigment in the Color Index (published by The Society of Dyers and Colourists) and any dyes known in the art may be used.

The black inorganic colorant may comprise at least one selected from the group consisting of carbon black, titanium black, a Cu—Fe—Mn-based oxide, and a metal oxide. Specifically, it is preferred to use carbon black as the black inorganic colorant in view of pattern characteristics and chemical resistance.

The Cu—Fe—Mn-based oxide includes, for example, $Cu_{1.5}Mn_{1.5}O_4$, $CuFeMnO_4$, $MnO_2$, and $FeMn_2O_4$, and the like.

The metal oxide may be a metal oxide such as a synthetic iron black, and examples thereof include $FeO$, $Fe_2O_3$, $Fe_3O_4$, and the like.

Particular examples of the black organic colorant may include aniline black, lactam black, perylene black, and the like. Preferred among them is lactam black (e.g., Black 582 from BASF) in view of optical density, dielectricity, and the like.

The colorant comprises 50 to 100% by weight of a black inorganic colorant based on the total weight of the solid content of the colorant. Specifically, the colorant may comprise 50 to 100% by weight of a black inorganic colorant and 0 to 50% by weight of a black organic colorant based on the total weight of the solid content of the colorant. More specifically, the colorant may comprise 80 to 100% by weight of a black inorganic colorant and 0 to 20% by weight of a black organic colorant based on the total weight of the solid content of the colorant. If the amount of the black inorganic colorant and/or the black organic colorant in the colorant is within the above range, it is more advantageous to achieve a high optical density capable of preventing light leakage in the visible light and infrared light regions.

The amount of the black colorant may be 10 to 60% by weight, 20 to 50% by weight, 20 to 45% by weight, 25 to 50% by weight, or 30 to 50% by weight, based on the total weight of the solid content (i.e., the weight excluding solvents) of the colored photosensitive resin composition. Within the above range, it is more advantageous to achieve a high optical density capable of preventing light leakage.

Meanwhile, the colorant used in the present invention may be added to the colored photosensitive resin composition in the form of a mill base as mixed with a dispersion resin, a solvent, or the like.

The dispersion resin serves to uniformly disperse a pigment in a solvent and may be specifically at least one selected from the group consisting of a dispersant and a dispersion binder.

Examples of the dispersant may include any known dispersant for a colorant. Particular examples thereof include a cationic surfactant, an anionic surfactant, a nonionic surfactant, a zwitterionic surfactant, a silicon-based surfactant, a fluorine-based surfactant, a polyester-based compound, a polycarboxylic acid ester-based compound, an unsaturated polyamide-based compound, a polycarboxylic acid-based compound, a polycarboxylic acid alkyl salt compound, a polyacrylic compound, a polyethyleneimine-based compound, a polyurethane-based compound, polyurethane, a polycarboxylic acid ester represented by polyacrylate, unsaturated polyamide, polycarboxylic acid, an amine salt of polycarboxylic acid, an ammonium salt of polycarboxylic acid, an alkylamine salt of polycarboxylic acid, polysiloxane, a long chain polyaminoamide phosphate salt, an ester of polycarboxylic acid whose hydroxyl group is substituted and its modified product, an amide formed by reaction of polyester having a free carboxyl group with a poly(lower alkyleneimine) or a salt thereof, a (meth)acrylic acid-styrene copolymer, a (meth)acrylic acid-(meth)acrylate ester copolymer, a styrene-maleic acid copolymer, polyvinyl alcohol, a water-soluble resin or a water-soluble polymer compound such as polyvinylpyrrolidone, modified polyacrylate, an adduct of ethylene oxide/propylene oxide, a phosphate ester, and the like. Commercially available dispersants may include Disperbyk-182, -183, -184, -185, -2000, -2150, -2155, -2163, and -2164 from BYK Co. These compounds may be used alone or in combination of two or more. The dispersant may have an amine group and/or an acid group as a pigment-affinity group and may optionally be of an ammonium salt type.

The dispersant may be added in advance to a colorant through surface treatment of the colorant therewith or added together with a colorant at the time of preparing a colored photosensitive resin composition.

The amine value of the dispersant may be 10 to 200 mg KOH/g, 40 to 200 mg KOH/g, or 50 to 150 mg KOH/g. If the amine value of the dispersant is within the above range, the dispersibility and storage stability of the colorant are excellent, and the roughness of the surface of a cured film formed from the resin composition is improved.

The dispersant may be employed in an amount of 1 to 20% by weight, or 2 to 15% by weight, based on the total weight of the colored dispersion. If the amount of the dispersant is within the above range, the colorant is effectively dispersed to improve the dispersion stability, and the optical, physical, and chemical properties are improved by virtue of maintaining an appropriate viscosity when it is applied. Thus, it is desirable in terms of an excellent balance between dispersion stability and viscosity.

Further, the colorant comprises a dispersion resin, and the dispersion resin has an amine value of 3 mg KOH/g or less and may comprise 50% by mole or less of a maleimide monomer based on the total number of moles of the constituent units. In such event, the dispersion resin may be a dispersion binder.

If the dispersion binder has an acid value, it may comprise a monomer having a carboxyl group and an unsaturated bond. Particular examples of the monomer having a carboxyl group and an unsaturated bond include a monocarboxylic acid such as acrylic acid, methacrylic acid, and crotonic acid; a dicarboxylic acid such as fumaric acid, mesaconic acid, and itaconic acid, and an anhydride of the dicarboxylic acid; a mono(meth)acrylate of a polymer having a carboxyl group and a hydroxyl group at both terminals such as ω-carboxypolycaprolactonemono(meth)acrylates, and the like. Preferred are acrylic acid and methacrylic acid.

In addition, the dispersion binder may comprise a monomer having a carboxyl group and an unsaturated bond and a monomer having a copolymerizable unsaturated bond. Examples of the monomer having a copolymerizable unsaturated bond may, for example, include an aromatic vinyl compound such as styrene, vinyltoluene, α-methylstyrene, p-chlorostyrene, o-methoxystyrene, m-methoxystyrene, p-methoxystyrene, o-vinylbenzyl methyl ether, m-vinylbenzyl methyl ether, p-vinylbenzyl methyl ether, o-vinyl benzyl glycidyl ether, m-vinyl benzyl glycidyl ether, and p-vinylbenzyl glycidyl ether; an alkyl (meth)acrylate such as methyl (meth)acrylate, ethyl (meth)acrylate, n-propyl (meth)acrylate, i-propyl (meth)acrylate, n-butyl (meth)acrylate, i-butyl (meth)acrylate, sec-butyl (meth)acrylate, and t-butyl (meth)acrylate; an alicyclic (meth)acrylates such as cyclopentyl (meth)acrylate, cyclohexyl (meth)acrylate, 2-methylcyclohexyl (meth)acrylate, tricyclo[$5.2.1.0^{2,6}$]decan-8-yl (meth)acrylate, 2-dicyclopentanyloxyethyl (meth)acrylate, and isobornyl (meth)acrylate; an aryl (meth)acrylate such as phenyl (meth)acrylate and benzyl (meth)acrylate; a hydroxyalkyl (meth)acrylate such as 2-hydroxyethyl (meth)acrylate and 2-hydroxypropyl (meth)acrylate; an N-substituted maleimide compound such as N-cyclohexylmaleimide, N-benzylmaleimide, N-phenylmaleimide, N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, and N-p-methoxyphenylmaleimide; an unsaturated amide compound such as (meth)acrylamide and N,N-dimethyl (meth)acrylamide; and an unsaturated oxetane compound such as 3-(methacryloyloxymethyl)oxetane, 3-(methacryloyloxymethyl)-3-ethyloxetane, 3-(methacryloyloxymethyl)-2-trifluoromethyloxetane, 3-(methacryloyloxymethyl)-2-phenyloxetane, 2-(methacryloyloxymethyl)oxetane, and 2-(methacryloyloxymethyl)-4-trifluoromethyloxetane, which may be used alone or in combination of two or more.

The dispersion binder may comprise 50% by mole or less of a maleimide monomer based on the total number of moles of the constituent units.

The dispersion binder may have an acid value of 30 to 200 mg KOH/g. Specifically, the dispersion binder may have an acid value of 50 to 150 mg KOH/g. If the acid value of the dispersion binder is within the above range, the impact of the dispersant encircling the pigment on the amine value is reduced, thereby producing the effects of excellent stability of the colored dispersion and uniform particle size.

Further, if the amine value of the dispersion binder exceeds 3 mg KOH/g, the stability of the dispersant encircling the pigment may be adversely affected, which may in turn adversely affect the storage stability of the entire resin composition. Thus, the amine value of the dispersion binder is preferably 3 mg KOH/g or less. If the amine value of the dispersion binder is within the above range, the unexposed portion can be readily developed in the development process, and such problems as residues generation can be improved.

The dispersion binder may be employed in an amount of 1 to 20% by weight, or 2 to 15% by weight, based on the total weight of the colored dispersion. If the dispersion binder is employed in the above amount range, the resin composition can maintain an appropriate viscosity level, and it is preferable in terms of dispersion stability and develop ability.

The colored dispersion may be employed in an amount of 10 to 80% by weight, or 20 to 60% by weight, based on the total weight of the solid content of the colored photosensitive resin composition.

(E) Compound Derived from an Epoxy Resin and Having a Double Bond

The colored photosensitive resin composition of the present invention may further comprise a compound derived from an epoxy resin and having a double bond. The compound derived from an epoxy resin has at least one double bond, may have a cardo backbone structure, may be a novolak-based resin, or may be an acrylic acid resin containing a double bond in its side chain.

The weight average molecular weight (Mw) of the compound derived from an epoxy resin may be in the range of 3,000 to 18,000 g/mol, or 5,000 to 10,000 g/mol, when determined by gel permeation chromatography referenced to polystyrene. If the weight average molecular weight of the compound derived from an epoxy resin is within the above range, a pattern profile upon development may be favorable, and the step difference by a lower pattern may be advantageously improved.

Specifically, the epoxy resin may be a compound having a cardo backbone structure as represented by the following Formula 1.

[Formula 1]

In Formula 1 above, X is each independently

$L^1$ is each independently a $C_{1-10}$ alkylene group, a $C_{3-20}$ cycloalkylene group, or a $C_{1-10}$ alkyleneoxy group; $R_1$ to $R_7$ are each independently H, a $C_{1-10}$ alkyl group, a $C_{1-10}$ alkoxy group, a $C_{2-10}$ alkenyl group, or a $C_{6-14}$ aryl group; $R_8$ is H, methyl, ethyl, CH₃CHCl—, CH₃CHOH—, CH₂=CHCH₂—, or phenyl; and n is an integer from 0 to 10.

Particular examples of the $C_{1-10}$ alkylene group may include methylene, ethylene, propylene, isopropylene, butylene, isobutylene, sec-butylene, t-butylene, pentylene, isopentylene, t-pentylene, hexylene, heptylene, octylene, isooctylene, t-octylene, 2-ethylhexylene, nonylene, isononylene, decylene, isodecylene, and the like. Particular examples of the $C_{3-20}$ cycloalkylene group may include cyclopropylene, cyclobutylene, cyclopentylene, cyclohexylene, cycloheptylene, decalinylene, adamantylene, and the like. Particular examples of the $C_{1-10}$ alkyleneoxy group may include methyleneoxy, ethyleneoxy, propyleneoxy, butyleneoxy, sec-butyleneoxy, t-butyleneoxy, pentyleneoxy, hexyleneoxy, heptyleneoxy, octyleneoxy, 2-ethyl-hexyleneoxy, and the like. Particular examples of the $C_{1-10}$ alkyl group may include methyl, ethyl, propyl, isopropyl, butyl, isobutyl, sec-butyl, t-butyl, pentyl, isopentyl, t-pentyl, hexyl, heptyl, octyl, isooctyl, t-octyl, 2-ethylhexyl, nonyl, isononyl, decyl, isodecyl, and the like. Particular examples of the $C_{1-10}$ alkoxy group may include methoxy, ethoxy, propoxy, butyloxy, sec-butoxy, t-butoxy, pentoxy, hexyloxy, heptoxy, octyloxy, 2-ethyl-hexyloxy, and the like. Particular examples of the $C_{2-10}$ alkenyl group may include vinyl, allyl, butenyl, propenyl, and the like. Particular examples of the $C_{6-14}$ aryl group may include phenyl, tolyl, xylyl, naphthyl, and the like.

As an example, the epoxy resin having a cardo backbone structure may be prepared through the following synthesis route:

[Reaction Scheme 1]

In Reaction Scheme 1 above, Hal is a halogen; and X, $R_1$, $R_2$, and $L_1$ are the same as defined in Formula 1.

The compound derived from the epoxy resin having a cardo backbone structure may be obtained by reacting the epoxy resin having a cardo backbone structure with an unsaturated basic acid to produce an epoxy adduct and then reacting the epoxy adduct thus obtained with a polybasic acid anhydride, or by further reacting the product thus obtained with a monofunctional or polyfunctional epoxy compound. Any unsaturated basic acid known in the art, e.g., acrylic acid, methacrylic acid, crotonic acid, cinnamic acid, sorbic acid, and the like, may be used. Any polybasic acid anhydride known in the art, e.g., succinic anhydride, maleic anhydride, trimellitic anhydride, pyromellitic anhydride, 1,2,4,5-cyclohexane tetracarboxylic dianhydride, hexahydrophthalic anhydride, and the like, may be used. Any monofunctional or polyfunctional epoxy compound known in the art, e.g., glycidyl methacrylate, methyl glycidyl ether, ethyl glycidyl ether, propyl glycidyl ether, isopropyl glycidyl ether, butyl glycidyl ether, isobutyl glycidyl ether, bisphenol Z glycidyl ether, and the like, may be used.

As an example, the compound derived from the epoxy resin having a cardo backbone structure may be prepared through the following synthesis route:

[Reaction Scheme 2]

In Reaction Scheme 2 above, $R_9$ is each independently H, a $C_{1-10}$ alkyl group, a $C_{1-10}$ alkoxy group, a $C_{2-10}$ alkenyl group, or a $C_{6-14}$ aryl group; $R_{10}$ and $R_{11}$ are each independently a saturated or unsaturated $C_6$ aliphatic or aromatic ring; n is an integer from 1 to 10; and X, $R_1$, $R_2$, and $L_1$ are the same as defined in Formula 1.

In the case where the compound derived from the epoxy resin having a cardo backbone structure is used, the cardo backbone structure may improve the adhesiveness of a cured material to a substrate, alkaline resistance, processability, strength, and the like. Further, an image in a fine resolution may be formed in a pattern once an uncured part is removed upon development.

The amount of the compound derived from an epoxy resin may be 0 to 40% by weight, or 0 to 30% by weight, based on the total weight of the solid content (i.e., the weight excluding solvents) of the colored photosensitive resin composition. If the compound derived from an epoxy resin is employed within the above amount range, a pattern profile upon development may be favorable, and the development time and surface characteristics of a cured film formed from the resin composition can be improved.

In the colored photosensitive resin composition of the present invention, the molar ratio of the double bonds in the photopolymerizable compound (B) and in the compound derived from an epoxy resin (E) to the epoxy groups in the copolymer (A) satisfies the following relationship:

4≤number of moles of double bonds/number of moles of epoxy groups≤35.

Specifically, in the colored photosensitive resin composition of the present invention, the molar ratio of the double bonds in the photopolymerizable compound (B) and in the compound derived from an epoxy resin (E) to the epoxy groups in the copolymer (A) satisfies the following relationship:

11≤number of moles of double bonds/number of moles of epoxy groups≤35.

(F) Epoxy Compound

The colored photosensitive resin composition of the present invention may further comprise an epoxy compound so as to increase the internal density of the resin, to thereby improve the chemical resistance of a cured film prepared therefrom.

The epoxy compound may be an unsaturated monomer containing at least one epoxy group, or a homo-oligomer or a hetero-oligomer thereof. Examples of the unsaturated monomer containing at least one epoxy group may include glycidyl (meth)acrylate, 4-hydroxybutylacrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methylallyl glycidyl ether, o-vinylbenzyl glycidyl ether, m-vinylbenzyl glycidyl ether, p-vinylbenzyl glycidyl ether, or a mixture thereof. Specifically, glycidyl (meth)acrylate may be used.

Examples of the commercially available homo-oligomer of an unsaturated monomer containing at least one epoxy group may include GHP03 (glycidyl methacrylate, Miwon Commercial Co., Ltd.).

The epoxy compound (F) may further comprise the following structural unit.

Particular examples may include any structural unit derived from styrene; a styrene having an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; a styrene having a halogen such as fluorostyrene, chlorostyrene, bromostyrene, and iodostyrene; a styrene having an alkoxy substituent such as methoxystyrene, ethoxystyrene, and propoxystyrene; p-hydroxy-α-methylstyrene, acetylstyrene; an ethylenically unsaturated compound having an aromatic ring such as divinylbenzene, vinylphenol, o-vinylbenzyl methyl ether, m-vinylbenzyl methyl ether, and p-vinylbenzyl methyl ether; an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly(ethylene glycol) methyl ether (meth)acrylate, phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine having an N-vinyl group such as N-vinyl pyrrolidone, N-vinyl carbazole, and N-vinyl morpholine; an unsaturated ether such as vinyl methyl ether, and vinyl ethyl ether; an unsaturated imide such as N-phenylmaleimide, N-(4-chlorophenyl)maleimide, N-(4-hydroxyphenyl)maleimide, and N-cyclohexylmaleimide. The structural unit derived from the above exemplary compounds may be contained in the epoxy compound (F) alone or in combination of two or more thereof.

The epoxy compound (F) may have a weight average molecular weight of 100 to 30,000 g/mol. Specifically, the epoxy compound (F) may have a weight average molecular weight of 100 to 15,000 g/mol. If the weight average molecular weight of the epoxy compound is 100 g/mol or more, the hardness of a thin film can be more excellent. If the weight average molecular weight of the epoxy compound is 30,000 g/mol or less, the thickness of a thin film becomes uniform with a smaller step difference, which is more suitable for planarization. The weight average molecular weight is determined by gel permeation chromatography (eluent: tetrahydrofuran) referenced to polystyrene.

The amount of the epoxy compound may be 0 to 10% by weight, or 0 to 8% by weight, based on the total weight of the solid content (i.e., the weight excluding solvents) of the colored photosensitive resin composition. If the amount of the epoxy compound is within the above amount range, a pattern profile upon development may be favorable, such properties as chemical resistance and elastic restoring force may be improved, and it is possible to prevent the problem that peeling occurs in the development process or that the storage stability of the composition is deteriorated.

In the colored photosensitive resin composition of the present invention, the molar ratio of the double bonds in the photopolymerizable compound (B) to the epoxy groups in the copolymer (A) and in the epoxy compound (F) may satisfy the following relationship:

4≤number of moles of double bonds/number of moles of epoxy groups≤35.

In addition, in the colored photosensitive resin composition of the present invention, the molar ratio of the double bonds in the photopolymerizable compound (B) and in the compound derived from an epoxy resin (E) to the epoxy groups in the copolymer (A) and in the epoxy compound (F) may satisfy the above relationship.

Specifically, in the colored photosensitive resin composition, the molar ratio of the double bonds in the photopolymerizable compound (B) to the epoxy groups in the copolymer (A) and in the epoxy compound (F) to may satisfy the following relationship.

In addition, in the colored photosensitive resin composition of the present invention, the molar ratio of the double bonds in the photopolymerizable compound (B) and in the compound derived from an epoxy resin (E) to the epoxy groups in the copolymer (A) and in the epoxy compound (F) may satisfy the above relationship:

11≤number of moles of double bonds/number of moles of epoxy groups≤35.

(G) Surfactant

The colored photosensitive resin composition of the present invention may further comprise a surfactant so as to improve the coatability and to prevent generation of defects.

Although the kind of the surfactant is not particularly limited, for example, a fluorine-based surfactant or silicon-based surfactant having a cyclic structure may be used.

The commercially available silicon-based surfactant may include DC3PA, DC7PA, SH11PA, SH21PA, and SH8400 from Dow Corning Toray Silicon, TSF-4440, TSF-4300, TSF-4445, TSF-4446, TSF-4460, and TSF-4452 from GE Toshiba Silicone, BYK-333, BYK-307, BYK-3560, BYK UV-3535, BYK-361N, BYK-354, and BYK-399 from BYK, and the like. This surfactant may be used alone or in combination of two or more.

The commercially available fluorine-based surfactant may include Megaface F-470, F-471, F-475, F-482, F-489, and F-563 from Dainippon Ink Kagaku Kogyo Co. (DIC).

Preferred among these surfactants may be BYK-333 and BYK-307 from BYK and F-563 from DIC in view of the coatability of the composition.

The amount of the surfactant may be 0.01 to 5% by weight, or 0.05 to 2% by weight, based on the total weight of the solid content (i.e., the weight excluding solvents) of the colored photosensitive resin composition. If the amount of the surfactant is within the above range, the colored photosensitive resin composition may be smoothly coated.

(H) Solvent

The colored photosensitive resin composition of the present invention may preferably be prepared as a liquid composition in which the above components are mixed with a solvent. Any solvent known in the art and used in the preparation of colored photosensitive resin compositions, which is compatible but not reactive with the components of the colored photosensitive resin composition, may be employed.

Examples of the solvent may include a glycol ether such as ethylene glycol monoethyl ether; an ethylene glycol alkyl ether acetate such as ethyl cellosolve acetate; an ester such as ethyl 2-hydroxypropionate; a diethylene glycol such as diethylene glycol monomethyl ether; a propylene glycol alkyl ether acetate such as propylene glycol monomethyl ether acetate and propylene glycol propyl ether acetate; and an alkoxyalkyl acetate such as 3-methoxybutyl acetate. The solvent may be used alone or in combination of two or more.

The amount of the solvent is not specifically limited, but may be 50 to 90% by weight, or 70 to 85% by weight, based on the total weight of the colored photosensitive resin composition finally prepared in view of the coatability and stability of the colored photosensitive resin composition finally obtained. If the amount of the solvent is within the above range, the resin composition is smoothly coated, and the delay margin, which may occur in the working process, is small.

In addition, the colored photosensitive resin composition of the present invention may comprise other additives such as an antioxidant and a stabilizer as long as the physical properties of the colored photosensitive resin composition are not adversely affected.

The colored photosensitive resin composition of the present invention comprising the above-described components may be prepared by a common method, for example, by the following method.

First, a colorant is mixed with a solvent in advance and dispersed therein using a bead mill until the average particle diameter of the colorant reaches a desired level. In such event, a surfactant and/or a dispersant may be used. Further, a portion or the whole of a copolymer may be blended. Added to the dispersion thus obtained are the remainder of the copolymer and the surfactant, a photopolymerizable compound, and a photopolymerization initiator. A compound derived from an epoxy resin, an additive such as an epoxy compound or an additional solvent, if necessary, is further blended to a certain concentration, followed by sufficiently stirring them to obtain a desired colored photosensitive resin composition.

A cured film formed from the colored photosensitive resin composition may have an optical density of $1.0/\mu m$ to $3.0/\mu m$. Specifically, a cured film formed from the colored photosensitive resin composition may have an optical density of $1.0/\mu m$ to $2.5/\mu m$ or $1.5/\mu m$ to $2.0/\mu m$. If the optical density per 1 μm in thickness of a cured film formed from the colored photosensitive resin composition is within the above range, it is effective to prevent light leakage of a display.

A cured film formed from the colored photosensitive resin composition may have an elastic recovery rate of 80% or more.

When a cured film formed from the colored photosensitive resin composition in a size of 3 cm×3 cm×3 um (width×length×thickness) was immersed in an organic solvent and treated at 100° C. for 1 hour, the organic solvent may have an absorbance at 437 nm of 0.5 or less. Specifically, when a cured film formed from the colored photosensitive resin composition in a size of 3 cm×3 cm×3 um (width×length×thickness) was immersed in an organic solvent and treated at 100° C. for 1 hour, the organic solvent may have an absorbance at 437 nm of 0.0001 to 0.5 or 0.001 to 0.4 or 0.01 to 0.4 or 0.01 to 0.3.

The present invention also provides a light shielding spacer produced from the colored photosensitive resin composition.

Specifically, the present invention provides a black column spacer (BCS) produced from the colored photosensitive resin composition, in which a column spacer and a black matrix are integrated into one module.

The light shielding spacer may be prepared through a coating formation step, a light exposure step, a development step, and a thermal treatment step.

In the coating formation step, the colored photosensitive resin composition according to the present invention is coated on a pre-treated substrate by a spin coating method, a slit coating method, a roll coating method, a screen printing method, an applicator method, or the like in a desired thickness, for example, 1 to 25 μm, which is then pre-cured at a temperature of 70 to 100° C. for 1 to 10 minutes to form a coating by removing the solvent therefrom.

In order to form a pattern on the coated film, a mask having a predetermined shape is placed thereon, which is then irradiated with activated rays having 200 to 500 nm. In such event, in order to produce an integrated-type black column spacer, a mask having patterns with different transmittances may be used to prepare a column spacer and a black matrix at the same time. As a light source used for the irradiation, a low-pressure mercury lamp, a high-pressure mercury lamp, an extra high-pressure mercury lamp, a metal halide lamp, an argon gas laser, or the like may be used; and X-rays, electronic rays, or the like may also be used, if desired. The rate of light exposure may vary depending on the kind and the compositional ratio of the components of the composition and the thickness of a dried coating. If a high-pressure mercury lamp is used, the rate of light exposure may be 500 $mJ/cm^2$ or less (at the wavelength of 365 nm).

Subsequent to the light exposure step, an aqueous alkaline solution such as sodium carbonate, sodium hydroxide, potassium hydroxide, tetramethylammonium hydroxide, or the like may be used as a developing solvent to dissolve and remove unnecessary portions, whereby only an exposed portion remains to form a pattern. An image pattern obtained by the development is cooled to room temperature and post-baked in a hot air circulation-type drying furnace at a temperature of 180 to 250° C. for 10 to 60 minutes, thereby obtaining a final pattern.

The light shielding spacer thus produced may be used in the manufacture of electronic parts of an LCD, an OLED display, and the like by virtue of its excellent physical properties. Thus, the present invention provides an electronic part comprising the light shielding spacer.

The LCD, OLED display, and the like may comprise other components known to those skilled in the art, except that they are provided with the light shielding spacer of the present invention. That is, an LCD, an OLED display, and the like, to which the light shielding spacer of the present invention can be applied, may fall within the scope of the present invention.

Hereinafter, the present invention will be described in more detail with reference to the following examples. However, these examples are set forth to illustrate the present invention, and the scope of the present invention is not limited thereto.

Preparation Example 1: Preparation of a Copolymer

A 500 ml, round-bottomed flask equipped with a refluxing condenser and a stirrer was charged with 100 g of a mixture consisting of 51% by mole of N-phenylmaleimide (PMI), 4% by mole of styrene (Sty), 10% by mole of 4-hydroxybutyl acrylate glycidyl ether (4-HBAGE), and 35% by mole of methacrylic acid (MAA), along with 300 g of propylene glycol monomethyl ether acetate (PGMEA) as a solvent and 2 g of 2,2'-azobis(2,4-dimethylvaleronitrile) as a radical polymerization initiator. The mixture was then heated to 70° C. and stirred for 5 hours to obtain a copolymer solution (A) having a solid content of 31% by weight. The copolymer thus prepared had an acid value of 100 mg KOH/g and a weight average molecular weight (Mw) of 20,000 g/mol when measured by gel permeation chromatography and referenced to polystyrene.

Preparation Example 2: Preparation of a Compound Derived from an Epoxy Resin and Having a Cardo Backbone Structure

Step (1): Preparation of 9,9-bis[4-(glycidyloxy)phenyl]fluorene

A 3,000 ml, three-neck round-bottomed flask was charged with 200 g of toluene, 125.4 g of 4,4'-(9-fluorenylidene) diphenol, and 78.6 g of epichlorohydrin, and the mixture was heated to 40° C. with stirring to be dissolved. 0.1386 g of t-butylammonium bromide and a 50% aqueous NaOH solution (3 eq.) were mixed in a vessel, and the mixture was slowly added to the solution being stirred in the flask.

The reaction mixture thus obtained was heated to 90° C. and reacted for 1 hour to completely consume 4,4'-(9-fluorenylidene)diphenol, which was confirmed by HPLC or TLC. The reaction mixture was cooled to 30° C., and 400 ml of dichloromethane and 300 ml of 1 N HCl were added thereto with stirring. Then, the organic layer was separated, washed with 300 ml of distilled water twice or three times, dried over magnesium sulfate, and distilled under a reduced pressure to remove dichloromethane. The resultant was recrystallized using a mixture of dichloromethane and methanol to thereby obtain the title compound, which is an epoxy resin compound.

Step (2): Preparation of (((9H-fluorene-9,9-diyl)bis (4,1-phenylene))bis(oxy))bis(2-hydroxypropane-3,1-diyl) diacrylate (CAS No. 143182-97-2)

A 1,000 ml, three-necked flask was charged with 115 g of the compound obtained in step (1), 50 mg of tetramethylammonium chloride, 50 mg of 2,6-bis(1,1-dimethylethyl)-4-methylphenol, and 35 g of acrylic acid. The mixture was heated to 90-100° C. while air was blown at a flow rate of 25 ml/min, and it was further heated to 120° C. to be completely dissolved. The reaction mixture was stirred for about 12 hours until its acid value dropped to less than 1.0 mg KOH/g and then cooled to room temperature. Thereafter, 300 ml of dichloromethane and 300 ml of distilled water were added to the reaction mixture with stirring. The organic layer was separated, washed with 300 ml of distilled water twice or three times, dried over magnesium sulfate, and distilled under a reduced pressure to remove dichloromethane, thereby providing the title compound.

Step (3): Preparation of a Compound Derived from an Epoxy Resin and Having a Cardo Backbone Structure The compound obtained in step (2) in PGMEA was charged to a 1,000 ml, three-necked flask, and 1,2,4,5-benzenetetracarboxylic dianhydride (0.75 eq.), 1,2,3,6-tetrahydrophthalic anhydride (0.5 eq.), and triphenylphosphine (0.01 eq.) were further charged thereto. The reaction mixture was heated to 120-130° C. for 2 hours with stirring and then cooled to 80-90° C., which was stirred and heated for 6 hours. After the mixture was cooled to room temperature, a solution (solid content of 49% by weight) of a polymer (E) having a weight average molecular weight (Mw) of 6,000 g/mol and an acid value of 107 mg KOH/g (based on the solid content) was obtained.

Preparation Example 3: Preparation of a Colored Dispersion-(1)

A colored dispersion (D-1) was supplied from Tokushiki Co., Ltd., which dispersion had been prepared as follows.
22.5 g of an acrylic copolymer solution (a copolymer of benzyl methacrylate, styrene, and methacrylic acid) having a weight average molecular weight of 12,000 to 20,000 g/mol and an acid value of 80 to 150 mg KOH/g (Tokushiki Co., Ltd.), 8 g of an acrylic polymer dispersant having an amine value of 100 to 140 mg KOH/g (Tokushiki Co., Ltd.), 76.36 g of carbon black, and 384 g of PGMEA as a solvent were dispersed using a paint shaker at 25° C. for 6 hours. This dispersion step was performed with 0.3 mm zirconia beads. Upon completion of the dispersion step, the beads were removed from the dispersion through a filter, thereby obtaining a colored dispersion having a solid content of 21.37% by weight.

Preparation Example 4: Preparation of a Colored Dispersion-(2)

A colored dispersion (D-2) was supplied from Tokushiki Co., Ltd., which dispersion had been prepared in the same manner as in Preparation Example 3, except that lactam black (Black 582, BASF), which is a black organic colorant, was employed as a colorant.

Preparation Example 5: Preparation of an Epoxy Compound

A flask was charged with 150 g of glycidyl methacrylate, 2 g of 2,2'-azobisisobutyronitrile, and 450 g of PGMEA, and the flask was purged with nitrogen for 30 minutes. Thereafter, the flask was immersed in an oil bath with stirring, and the polymerization was carried out for 5 hours, while the reaction temperature was maintained at 80° C., whereby an epoxy compound solution (F) having a solid content of 22% by weight and a weight average molecular weight (Mw) of 12,000 g/mol was obtained.

The compounds prepared in the Preparation Examples above were used to prepare photosensitive resin compositions in the Examples and the Comparative Examples as below.
The following additional components were used.
Photopolymerizable compound (B): hexa-functional dipentaerythritol hexaacrylate (DPHA; manufactured by Nippon Kayaku)
Triazine-based photopolymerization initiator (C-1): (E)-2-(4-styrylphenyl)-4,6-bis(trichloromethyl)-1,3,5-triazine (manufacturer: PHARMASYNTHESE, brand name: TRIAZINE-Y)
Oxime-based photopolymerization initiator (C-2): N-1919 manufactured by ADEKA
Ketone-based photopolymerization initiator (C-3): 2-dimethylamino-2-(4-methylbenzyl)-1-(4-morpholin-4-yl-phenyl)-butane-1-one (manufacturer: Ciba, brand name: I-379)
Surfactant (G): BYK-333 manufactured by BYK
Solvent (H): propylene glycol monomethyl ether acetate (PGMEA) manufactured by Chemtronics.

Example 1: Preparation of a Colored Photosensitive Resin Composition 100 parts by weight of the copolymer (solid content) obtained in Preparation Example 1 as the copolymer (A), 163.2 parts by weight of the photopolymerizable compound (B), 7.1 parts by weight of the triazine-based photopolymerization initiator (C-1), 8.6 parts by weight of the oxime-based photopolymerization initiator (C-2), 8.9 parts by weight of the ketone-based photopolymerization initiator (C-3), 249.8 parts by weight of the colored dispersion (D-1), 175.4 parts by weight of the solution (solid content) of the polymer (E), and 0.7 part by weight of the surfactant (G) were mixed, followed by an addition of the solvent (H) thereto such that the solid content reached 19% by weight. The resultant was mixed using a shaker for 2 hours to thereby prepare a liquid-phase colored photosensitive resin composition.

Examples 2 to 10 and Comparative Examples 1 to 5: Preparation of Colored Photosensitive Resin Compositions Colored photosensitive resin compositions were prepared in the same manner as in Example 1, except that the composition of the resin compositions and the amounts of the components were changed as shown in the following Tables 1 and 2.

TABLE 1

| Component (part by wt.) | | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Copolymer (A) | | 100.0 | 100.0 | 100.0 | 100.0 | 100.0 | 100.0 | 100.0 | 100.0 | 100.0 | 100.0 |
| Photopolymerizable compound (B) | | 163.2 | 163.2 | 163.2 | 82.7 | 133.6 | 163.2 | 181.7 | 163.2 | 163.2 | 163.2 |
| Photopolymerization initiator (C) | C-1 | 7.1 | 7.8 | 8.1 | 4.2 | 4.2 | 7.9 | 8.3 | 7.3 | 7.5 | 8.3 |
| | C-2 | 8.6 | 9.3 | 9.7 | 5.1 | 5.1 | 9.5 | 10 | 8.8 | 9.0 | 10.0 |
| | C-3 | 8.9 | 9.7 | 10.1 | 5.3 | 5.3 | 9.9 | 10.4 | 9.1 | 9.4 | 10.4 |
| | Total | 24.6 | 26.8 | 28 | 14.6 | 14.6 | 27.2 | 28.6 | 25.2 | 25.9 | 28.6 |

TABLE 1-continued

| Component (part by wt.) | | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Colorant (D) | D-1 | 249.8 | 217.2 | 198.6 | 118.4 | 110.9 | 221.1 | 232.5 | 240.3 | 229.5 | 188.3 |
| | D-2 | — | 92.3 | 144.7 | 50.3 | 62.8 | 94.0 | 98.8 | 26.7 | 57.2 | 173.8 |
| Compound derived from epoxy (E) | | 175.4 | 175.4 | 175.4 | 39.6 | 0.0 | 175.4 | 187.8 | 175.4 | 175.4 | 175.4 |
| Epoxy compound (F) | | — | — | — | 16.9 | — | 7.9 | — | — | — | — |
| Surfactant (G) | | 0.7 | 0.8 | 0.8 | 0.4 | 0.4 | 0.8 | 0.8 | 0.7 | 0.8 | 0.8 |

TABLE 2

| Component (part by wt.) | | Comp. Ex. 1 | Comp. Ex. 2 | Comp. Ex. 3 | Comp. Ex. 4 | Comp. Ex. 5 |
|---|---|---|---|---|---|---|
| Copolymer (A) | | 100 | 100 | 100 | 100 | 100 |
| Photopolymerizable compound (B) | | 163.2 | 100.0 | 203.0 | 163.2 | 163.2 |
| Photopoly- merization initiator (C) | C-1 | 9.9 | 4.1 | 8.9 | 9.0 | 8.4 |
| | C-2 | 11.9 | 4.9 | 10.7 | 10.8 | 10.1 |
| | C-3 | 12.4 | 5.1 | 11.2 | 11.3 | 10.6 |
| | Total | 34.2 | 14.2 | 30.8 | 31.1 | 29.1 |
| Colorant (D) | D-1 | 104.0 | 115.3 | 250.1 | 151.3 | 180.6 |
| | D-2 | 412.4 | 49.0 | 106.3 | 278.6 | 195.6 |
| Compound derived from epoxy (E) | | 175.4 | — | 202.0 | 175.4 | 175.4 |
| Epoxy compound (F) | | — | 33.0 | — | — | — |
| Surfactant (G) | | 1.0 | 0.4 | 0.9 | 0.9 | 0.8 |

Test Example 1: Preparation of a Cured Film from a Colored Photosensitive Resin Composition The colored photosensitive resin compositions obtained in the Examples and in Comparative Examples were each coated on a glass substrate using a spin coater and pre-baked at 95° C. for 150 seconds to form a coated film in a thickness of 4.8 μm. A pattern mask was placed on the coated film thus formed such that the gap with the substrate was maintained at 50 μm, wherein the pattern mask was composed of 100% full-tone (F/T) column spacer (CS) pattern and 30% half-tone (H/T) black matrix (BM) pattern. Thereafter, the coated film was irradiated with light at an exposure rate of 66 mJ/cm$^2$ based on a wavelength of 365 nm for a certain period of time using an aligner (model name: MA6), which emits light having a wavelength of 200 nm to 450 nm. It was then developed at 23° C. with an aqueous solution of potassium hydroxide diluted to a concentration of 0.04% by weight until the unexposed portion was completely washed out. The pattern thus formed was post-baked in an oven at 230° C. for 30 minutes to obtain a light shielding spacer (i.e., a patterned part) and a cured film (i.e., a non-patterned part) in a thickness of 3.0 μm (±0.1 μm). The results obtained in the following Test Examples are summarized in Table 3 below.

(1) Measurement of Changes in Development Time with Respect to Pre-Bake Temperature The pre-bake temperature was changed to 80° C. or 100° C. in the above process for the preparation of a cured film, and evaluation was carried out under the same conditions as above. Then, the time for which the unexposed portion was completely washed out (until the stage O-ring part of the development apparatus was completely seen behind the substrate) at 23° C. with an aqueous solution of potassium hydroxide diluted to a concentration of 0.04% by weight was measured. Further, the changes in the development time with respect to the changes in pre-bake temperature was converted and recorded.

(2) Measurement of Surface Characteristics (Contact-Type Thickness Measurement)

Winkles of the surface of the cured film thus prepared was measured by recording the vibration value of the vertical motion of the equipment probe tip using SCAN PLUS, which is an α-step instrument (Alpha-step profilometer), and the surface of the cured film was photographed with an optical microscope (STM6, Olympus).

(3) Measurement of Optical Density

The transmittance at 550 nm of the cured film (i.e., a non-patterned part) was measured using an optical density meter (361T manufactured by Xlite), and the optical density based on a thickness of 1 μm was determined.

(4) Measurement of Elastic Recovery Rate

A cured film having a total thickness of 3.0 μm (±0.1 μm) upon post-bake and a spacer dot pattern diameter of 30 to 35 μm was prepared according to the method for preparing a cured film as described above. The compressive displacement and the elastic recovery rate were measured according to the following measuring conditions using an elasticity instrument (FISCHERSCOPE® HM2000LT, Fisher Technology).

Specifically, a 50 μm×50 μm planar Vickers indenter in a tetragonal shape was used as an indenter for pressing the pattern. The measurement was carried out by a load-unload method. After a load of 1.96 mN was applied onto the dot pattern using the above-mentioned elasticity instrument, it was defined as an initial condition (H0) for measuring the mechanical properties, that is, the compressive displacement and the elastic recovery rate. Then, the load applied onto each pattern sample was increased at a rate of 5 mN/sec in the thickness direction up to 300 mN and maintained for 5 seconds, and the distance (H1) to which the indenter moved was measured. Upon completion of the holding for 5 seconds, the load was released at a rate of 5 mN/sec in the thickness direction. When the force applied to the dots by the indenter reached 1.96 mN, the force was maintained for 5 seconds. The distance (H2) to which the indenter moved was measured. The elastic recovery rate was calculated according to the following Equation 1.

Elastic recovery rate (%)=[(H1−H2)/(H1−H0)×100]   [Equation 1]

(5) Chemical Resistance

A substrate in a size of 3 cm×3 cm×3 μm (width×length×thickness) was prepared according to the method for preparing a cured film as described above. The substrate was immersed in 18 g of an N-methylpyrrolidone (NMP) solution and aged at 100° C. for 1 hour. Subsequently, the substrate was removed from the NMP solution, and the absorbance of the NMP solution at 437 nm was measured.

(6) Measurement of Step Difference

Figure 1:
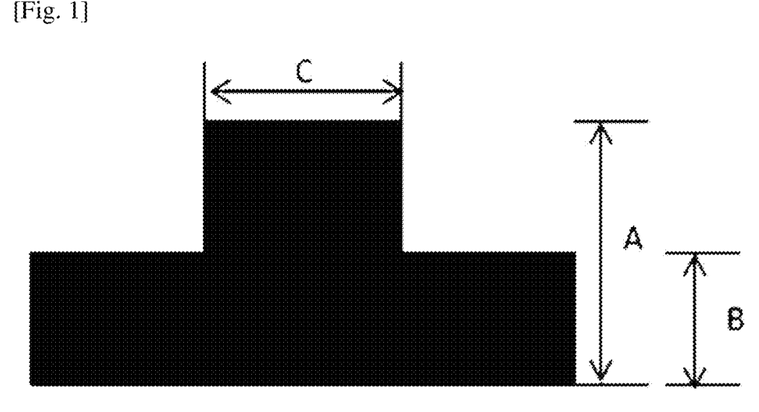
FIG. 1 is a schematic diagram of an embodiment of the cross-section of a light shielding spacer (or a black column spacer).
Figure 2:
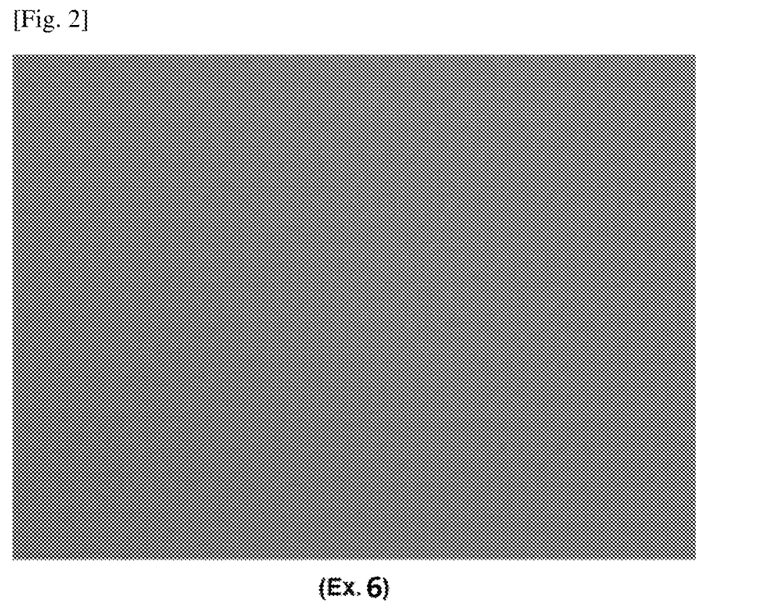
FIGS. 2 to 5 are photographs of the surfaces of the cured films prepared from the photosensitive resin compositions of Examples 6 and 7 and Comparative Examples 2 and 3, respectively.
Figure 3:
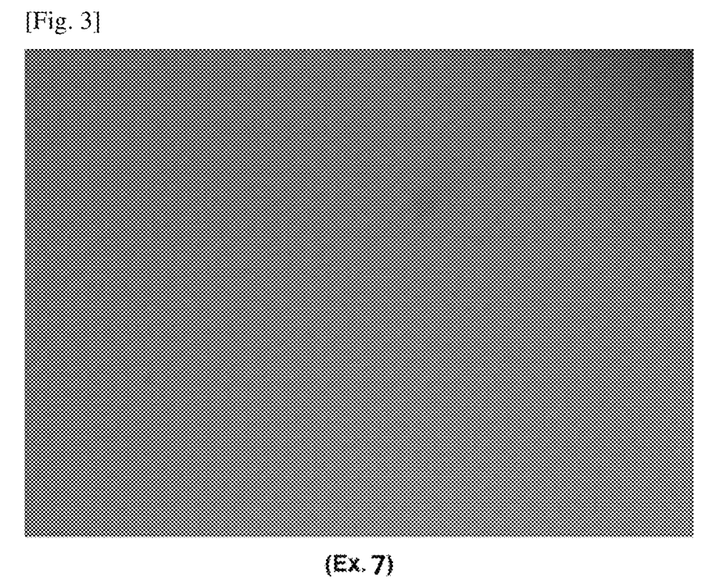
Figure 4:
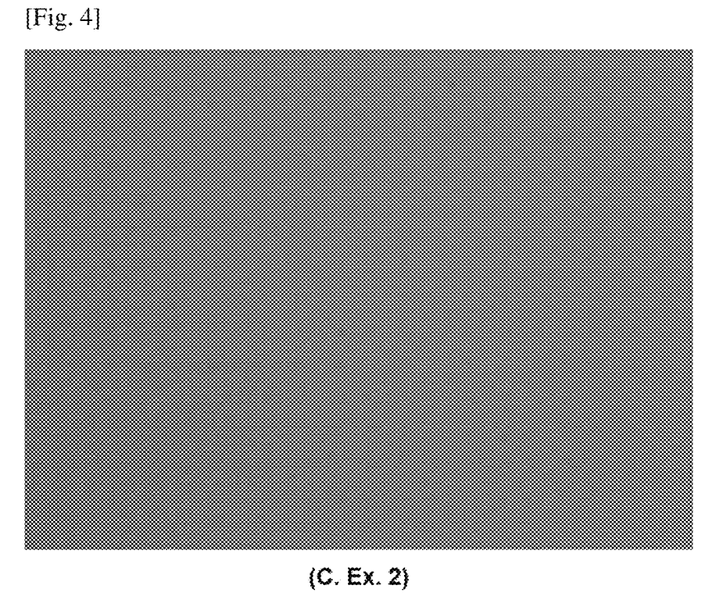
Figure 5:
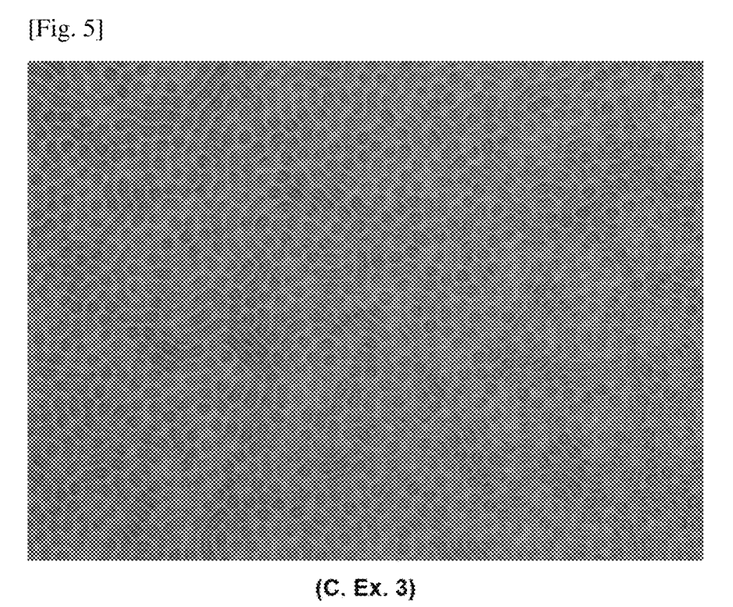

A spacer part (A) and a black matrix part (B) was obtained (see FIG. 1) according to the method for preparing a cured film as described above. The thickness of A and B was measured using a step difference measuring instrument (SNU(SIS-2000), SNU Precision). In such event, the step difference characteristics are expected to be excellent when the difference in thickness (i.e., A-B) is in the range of 1.0 to 2.0 µm.

The results obtained in the above Test Examples are summarized in Table 3 below, and the photographs of the surfaces of the cured films are shown in FIGS. 2 to 5.

TABLE 3

|  | No. of moles of double bonds/No. of moles of epoxy groups | Surface wrinkles (α-step ΔH) (□) | Change in development time with respect to change in pre-bake temp. (sec/□) | Chemical resistance (absorbance) | Elastic recovery rate (%) | Step difference (µm) | Optical Density (/µm) |
|---|---|---|---|---|---|---|---|
| Ex. 1 | 29.52 | 1,655 | 4 | 0.029 | 91 | 1.36 | 1.68 |
| Ex. 2 | 29.52 | 1,678 | 4 | 0.130 | 88 | 1.04 | 1.64 |
| Ex. 3 | 29.52 | 1,988 | 6 | 0.141 | 81 | 1.86 | 1.60 |
| Ex. 4 | 5.17 | 1,546 | 25 | 0.129 | 88 | 1.19 | 1.61 |
| Ex. 5 | 19.21 | 1,786 | 14 | 0.103 | 84 | 1.61 | 1.61 |
| Ex. 6 | 17.06 | 1,699 | 15 | 0.115 | 89 | 1.12 | 1.62 |
| Ex. 7 | 32.61 | 4,289 | 4 | 0.128 | 88 | 1.02 | 1.63 |
| Ex. 8 | 29.52 | 1,753 | 4 | 0.035 | 92 | 1.11 | 1.63 |
| Ex. 9 | 29.52 | 1,699 | 11 | 0.049 | 90 | 1.02 | 1.62 |
| Ex. 10 | 29.52 | 1,745 | 9 | 0.373 | 81 | 1.03 | 1.61 |
| C. Ex. 1 | 29.52 | 1,589 | 6 | 1.341 | 71 | 1.81 | 1.64 |
| C. Ex. 2 | 2.71 | 1,538 | 41 | 0.118 | 89 | 1.21 | 1.62 |
| C. Ex. 3 | 36.17 | 12,775 | 4 | 0.157 | 87 | 0.61 | 1.60 |
| C. Ex. 4 | 29.52 | 1,832 | 7 | 1.205 | 75 | 2.07 | 1.65 |
| C. Ex. 5 | 29.52 | 1,622 | 8 | 0.672 | 76 | 1.07 | 1.60 |

As shown in Table 3 and FIGS. 2 to 5, the compositions of the Examples, which fall within the scope of the present invention, not only provided cured films with minimized uneven wrinkles on their surfaces, which have excellent elastic recovery rate and excellent chemical resistance, but also enabled development in a short period of time. In contrast, the compositions of the Comparative Examples, which do not fall within the scope of the present invention, showed at least one unfavorable result.

REFERENCE NUMERALS OF THE DRAWINGS

A: thickness of the column spacer part
B: thickness of the black matrix part
C: Critical dimension (CD) of the column spacer part

The invention claimed is:

1. A colored photosensitive resin composition, which comprises:
(A) a copolymer comprising an epoxy group;
(B) a photopolymerizable compound comprising a double bond;
(C) a photopolymerization initiator; and
(D) a colorant comprising a black inorganic colorant,
wherein the colorant comprises 50 to 100% by weight of the black inorganic colorant based on the total weight of the solid content of the colorant, and
the molar ratio of the double bonds in the photopolymerizable compound (B) to the epoxy groups in the copolymer (A) satisfies the following relationship:

$4 \leq$ number of moles of double bonds/number of moles of epoxy groups $\leq 35$.

2. The colored photosensitive resin composition of claim 1, wherein the black inorganic colorant comprises at least one selected from the group consisting of carbon black, titanium black, a Cu—Fe—Mn-based oxide, and a metal oxide.

3. The colored photosensitive resin composition of claim 1, wherein the colorant comprises a black organic colorant.

4. The colored photosensitive resin composition of claim 1, wherein the colorant comprises a dispersion resin, and the dispersion resin has an amine value of 3 mg KOH/g or less and comprises 50% by mole or less of a maleimide monomer based on the total number of moles of the constituent units.

5. The colored photosensitive resin composition of claim 1, wherein a cured film formed from the colored photosensitive resin composition has an optical density of 1.0/µm to 3.0/µm.

6. The colored photosensitive resin composition of claim 1, which further comprises (E) a compound derived from an epoxy resin and having a double bond.

7. The colored photosensitive resin composition of claim 6, wherein the molar ratio of the double bonds in the photopolymerizable compound (B) and in the compound derived from an epoxy resin (E) to the epoxy groups in the copolymer (A) satisfies the following relationship:

$4 \leq$ number of moles of double bonds/number of moles of epoxy groups $\leq 35$.

8. The colored photosensitive resin composition of claim 6, which further comprises (F) an epoxy compound.

9. The colored photosensitive resin composition of claim 8, wherein the molar ratio of the double bonds in the photopolymerizable compound (B) and in the compound derived from an epoxy resin (E) to the epoxy groups in the copolymer (A) and in the epoxy compound (F) satisfies the following relationship:

$4 \leq$ number of moles of double bonds/number of moles of epoxy groups $\leq 35$.

10. The colored photosensitive resin composition of claim 1, which further comprises (F) an epoxy compound.

11. The colored photosensitive resin composition of claim 10, wherein the molar ratio of the double bonds in the photopolymerizable compound (B) to the epoxy groups in the copolymer (A) and in the epoxy compound (F) satisfies the following relationship:

$4 \leq$ number of moles of double bonds/number of moles of epoxy groups $\leq 35$.

12. The colored photosensitive resin composition of claim 1, wherein a cured film formed from the colored photosensitive resin composition has an elastic recovery rate of 80% or more.

13. The colored photosensitive resin composition of claim 1, wherein when a cured film formed from the colored photosensitive resin composition in a size of 3 cm×3 cm×3 μm (width×length×thickness) is immersed in an organic solvent and treated at 100° C. for 1 hour, the organic solvent has an absorbance at 437 nm of 0.5 or less.

14. A light shielding spacer produced from the colored photosensitive resin composition of claim 1.

\* \* \* \* \*